United States Patent
Naito (10) Patent No.: US 9,348,955 B2
(45) Date of Patent: May 24, 2016

(54) METHOD FOR SIMULATING DEFORMATION OF RUBBER COMPOUND WITH FILLER PARTICLES

(75) Inventor: Masato Naito, Kobe (JP)

(73) Assignee: SUMITOMO RUBBER INDUSTRIES, LTD., Kobe-Shi (JP)

( * ) Notice: Subject to any disclaimer, the term of this patent is extended or adjusted under 35 U.S.C. 154(b) by 808 days.

(21) Appl. No.: 13/564,308

(22) Filed: Aug. 1, 2012

(65) Prior Publication Data

US 2013/0085732 A1    Apr. 4, 2013

(30) Foreign Application Priority Data

Oct. 3, 2011    (JP) .................................. 2011-219427

(51) Int. Cl.
- G06F 17/50    (2006.01)
- G06F 7/60    (2006.01)
- G06F 7/48    (2006.01)

(52) U.S. Cl.
CPC .................................. G06F 17/5018 (2013.01)

(58) Field of Classification Search
CPC .................................................. G06F 17/5018
USPC ...................................................... 703/6, 1, 2
See application file for complete search history.

(56) References Cited

U.S. PATENT DOCUMENTS

| 7,415,398 | B2 * | 8/2008 | Naito et al. | 703/6 |
| 9,081,921 | B2 * | 7/2015 | Naito | |
| 2005/0086034 | A1 * | 4/2005 | Naito et al. | 703/2 |
| 2006/0106586 | A1 * | 5/2006 | Naito | 703/2 |
| 2011/0288838 | A1 * | 11/2011 | Hamatani et al. | 703/6 |
| 2013/0054208 | A1 * | 2/2013 | Naito | 703/2 |

FOREIGN PATENT DOCUMENTS

| JP | 2005-121535 A | 5/2005 |
| JP | 2005-146146 A | 6/2005 |
| JP | 2005-352819 A | 12/2005 |
| JP | 2006-193560 A | 7/2006 |
| JP | 2008-122154 A | 5/2008 |

(Continued)

OTHER PUBLICATIONS

Azari et al., "Effect of adhesive thickness on fatigue and fracture of toughened epoxy joints—Part II: Analysis and finite element modeling," Engineering Fracture Mechanics, vol. 78, 2011 pp. 138-152, XP027566037.

(Continued)

Primary Examiner — Kamini S Shah
Assistant Examiner — Juan Ochoa
(74) Attorney, Agent, or Firm — Birch, Stewart, Kolasch & Birch, LLP (57) ABSTRACT

A computerized method for simulating deformation of a rubber compound with filler particles comprises: a step in which a pseudo-two-dimensional rubber compound model of the rubber compound is generated; a step in which a deformation calculation is performed by the use of the pseudo-two-dimensional rubber compound model; and a step in which a necessary physical quantity is acquired from the deformation calculation. The pseudo-two-dimensional rubber compound model comprises a model of a rubber matrix and a plurality of models of filler particles. The pseudo-two-dimensional rubber compound model has a small thickness and has the same cross section in succession in the thickness direction.

2 Claims, 8 Drawing Sheets

(56) References Cited

FOREIGN PATENT DOCUMENTS

| | | |
|---|---|---|
| JP | 2009-196598 A | 9/2009 |
| JP | 2009-216612 A | 9/2009 |
| JP | 2009-276147 A | 11/2009 |
| JP | 2009-282569 A | 12/2009 |
| JP | 2010-49414 A | 3/2010 |
| JP | 2010-205165 A | 9/2010 |

OTHER PUBLICATIONS

Brinson et al., "Thermorheologically Complex Behavior of Multi-Phase Viscoelastic Materials," J. Mech. Phys. Solids, vol. 39, No. 7, 1991, pp. 859-880, XP024580383.

Extended European Search Report dated Dec. 21, 2012 for European Application No. 12181271.3.

* cited by examiner

METHOD FOR SIMULATING DEFORMATION OF RUBBER COMPOUND WITH FILLER PARTICLES

BACKGROUND OF THE INVENTION

The present invention relates to a computerized method for simulating deformation of a rubber compound with filler particles, more particularly to a method using a pseudo-two-dimensional rubber compound model capable of calculating a large deformation without increasing the model generation time.

In order to save time and cost for making prototypes of a rubber product made of a rubber compound, the use of a computer simulation for analyzing deformation of the rubber compound becomes popular in recent years.
Such simulation methods are disclosed in for example Japanese Patent Application Publication Nos. JP-A-2005-121535, JP-A-2005-146146, JP-A-2006-193560, JP-A-2008-122154, JP-A-2009-216612, JP-A-2009-276147, JP-A-2009-282569, JP-A-2010-205165, and JP-A-2010-49414.

Generally, the simulation methods are classified into a two-dimensional simulation method and a three-dimensional simulation method.

Figure 8A:
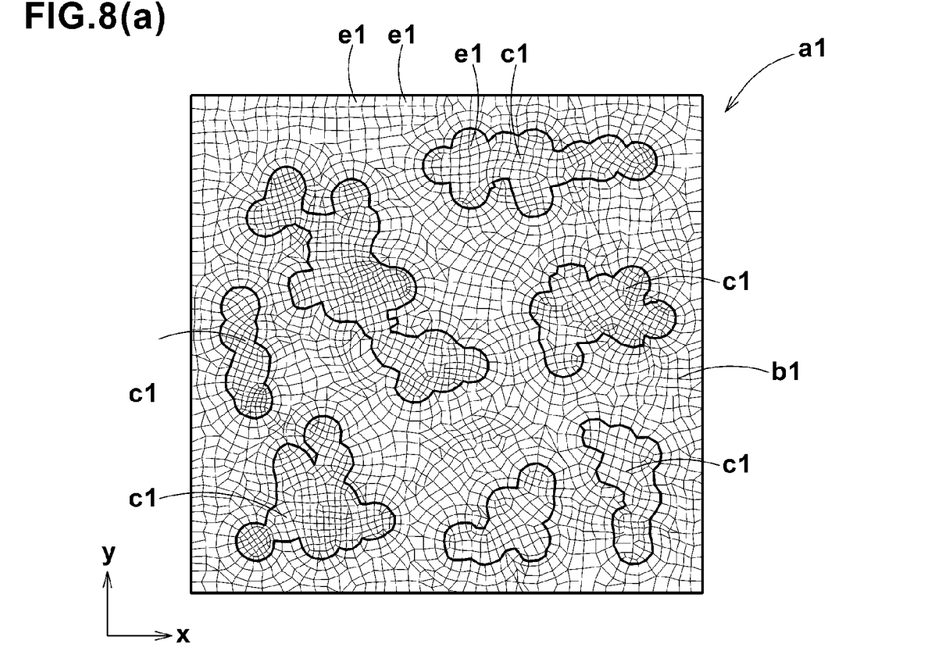
FIG. 8(a) and FIG. 8(b) are diagrams for explaining a two-dimensional rubber compound model and a three-dimensional rubber compound model.

In a two-dimensional simulation method, based on a sectional image of a rubber compound obtained by the use of a microscope, a two-dimensional rubber compound model a1 (finite element model) is generated as shown in FIG. 8(a).
The two-dimensional rubber compound model a1 is made up of a model b1 of the rubber matrix and models c1 of filler particles dispersed in the rubber matrix, and each model is defined by two-dimensional elements e1.
on the rubber matrix model b1 and filler particle models c1, materials properties are defined.
Then, a deformation calculation (simulation) is performed under predetermined conditions.

The generation of such two-dimensional rubber compound model a1 is relatively easy when compared with the undermentioned three-dimensional models.
However, the node points of each element e1 of the two-dimensional model are movable within only a two-dimensional plane, for example, movable only in x-direction and y-direction in a Cartesian coordinate system. There is no degree of freedom in z-direction perpendicular to the two-dimensional plane, namely, in the thickness direction of the rubber compound model a1.

Figure 8B:
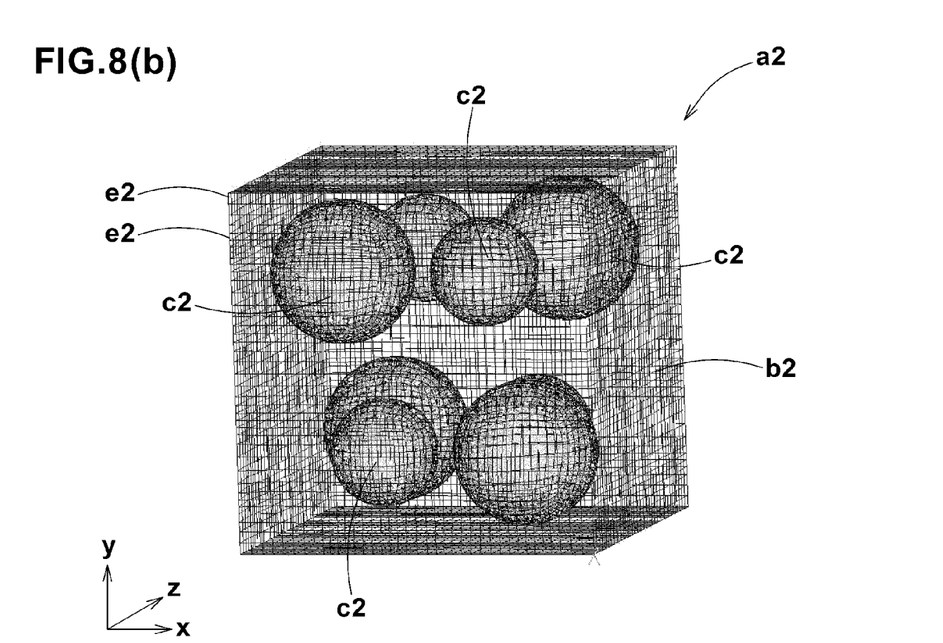

On the other hand, in a three-dimensional simulation method, for example, based on a plurality of sectional images of a rubber compound obtained through a technique of computer tomography, a three-dimensional internal structure of the rubber compound is reconstructed.
Then, using the data of the three-dimensional internal structure, a three-dimensional rubber compound model a2 is generated for example, as shown in FIG. 8(b) wherein for convenience sake, the filler particles are illustrated by a sphere.
The three-dimensional rubber compound model a2 is made up of a model b2 of the rubber matrix and models c2 of the filler particles, and each model is defined by three-dimensional elements e2.

In comparison with a two-dimensional model, such three-dimensional rubber compound model a2 requires a longer time for the generation. In return, it is possible to simulate a relatively large deformation since the node points of each element e2 have three degrees of freedom in x-, y- and z-directions.

On the other hand, when a deformation simulation is performed using a two-dimensional rubber compound model a1 in which the density of the filler particles is locally or entirely high, if a large deformation occurs locally in the rubber compound model, there is a possibility that the deformation calculation is stopped. Particularly, since the deformation freedom is less in the two-dimensional rubber compound model a1, with the progress of deformation, the strain of the elements e1 is increased, and often it becomes impossible to continue the deformation calculation.

As explained, in comparison with the three-dimension simulation method, the two-dimensional simulation method has the merit of shorter model generation time, but it is weak in large deformation calculation.
If the 2D and 3D rubber compound models a1 and a2 are the same in the volume percentage of the filler particles, then the 3D model can simulate a larger deformation than the 2D model.

SUMMARY OF THE INVENTION

It is therefore, an object of the present invention to provide a method for simulating deformation of a rubber compound with filler particles, in which a pseudo-two-dimensional rubber compound model is used, and thereby a large deformation calculation is possible without increasing the rubber compound model generation time.

According to the present invention, a computerized method for simulating deformation of a rubber compound with filler particles comprises:
a step in which a pseudo-two-dimensional rubber compound model of the rubber compound is generated, wherein the pseudo-two-dimensional rubber compound model comprises a model of a rubber matrix and a plurality of models of filler particles, and has a small thickness and has the same cross section in succession in the thickness direction;
a step in which a deformation calculation is performed by the use of the pseudo-two-dimensional rubber compound model; and
a step in which a necessary physical quantity is obtained from the deformation calculation.

The generating of the pseudo-two-dimensional rubber compound model may comprises:
a step of generating a two-dimensional model of the rubber compound at a cross section, wherein the two-dimensional model comprises a two-dimensional model of the rubber matrix and two-dimensional models of the filler particles;
a step of duplicating node points of the two-dimensional model at least once in the thickness direction; and
a step of linking the duplicated node points and the original node points to form the pseudo-two-dimensional rubber compound model.

The duplicating of the node points is preferably made at least twice so that the pseudo-two-dimensional rubber compound model has node points on the opposite surfaces and node points therebetween.

The node points on the opposite surfaces are defined as being immovable in the thickness direction, whereas the node points therebetween are defined as being movable in the thickness direction.

Therefore, the degree of deformation freedom of node points of elements of the pseudo-two-dimensional rubber compound model becomes increased when compared with a two-dimensional rubber compound model, therefore, it is possible to make a large deformation calculation.

Further, since the pseudo-two-dimensional rubber compound model has the same cross section in the thickness direction, it can be formed easily by duplicating a two-dimensional model. Therefore, its generation time can be remarkably shortened when compared with a three-dimensional model.

Thus, in the method according to the present invention, a large deformation calculation is possible and the rubber compound model generation time can be shortened.

DESCRIPTION OF THE PREFERRED EMBODIMENTS

Embodiments of the present invention will now be described in detail in conjunction with accompanying drawings.

Figure 1:
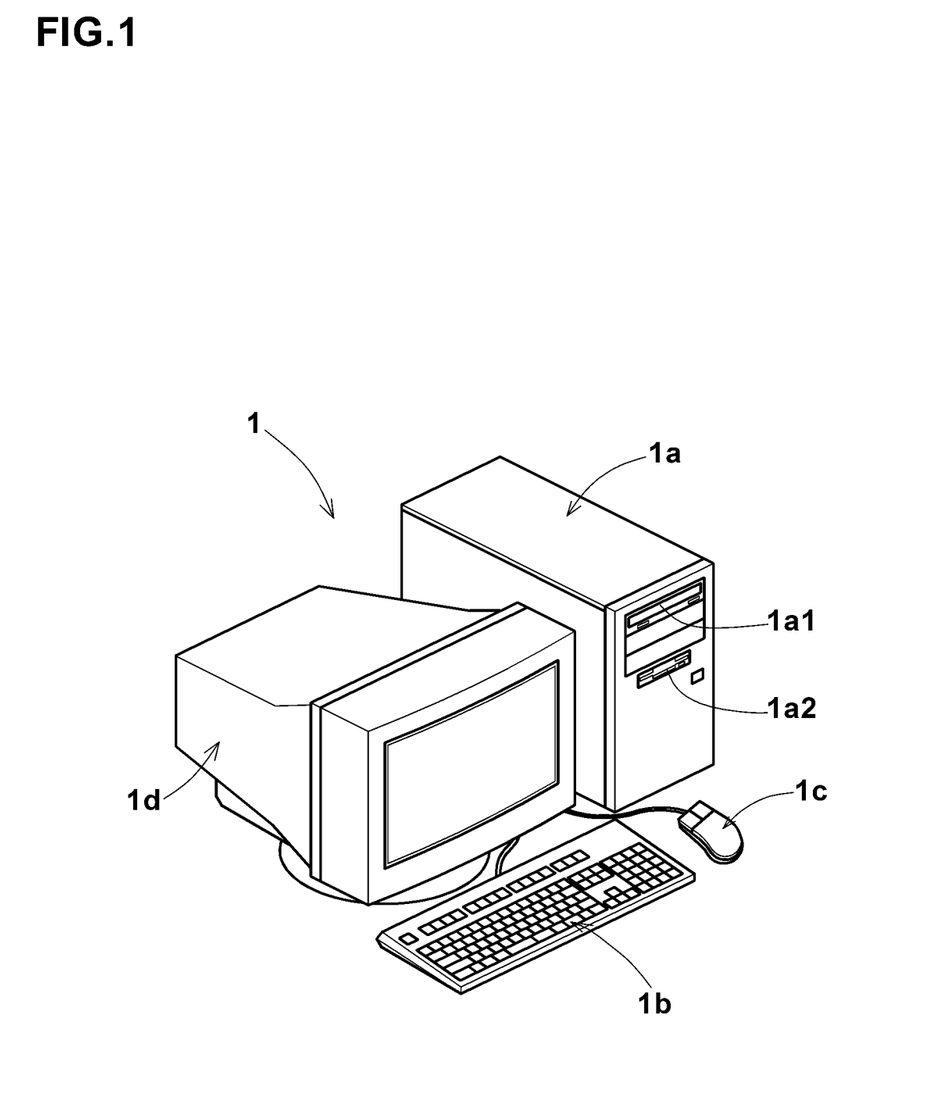
FIG. 1 is a perspective view of a computer system usable in the method for simulating deformation of a rubber compound according to the present invention.

The present invention is directed to a computerized method for simulating deformation of a rubber compound. The rubber compound as the analysis object comprises a rubber component as the rubber matrix and filler particles dispersed in the rubber matrix. The rubber component can be, for example, natural rubber (NR), isoprene rubber (IR), butyl rubber (IIR), butadiene rubber (BR), styrene butadiene rubber (SBR), styrene isoprene butadiene rubber (SIBR), ethylene-propylene-diene rubber (EPDM), chloroprene rubber (CR), acrylonitrile butadiene rubber (NBR) and the like. The filler can be carbon black, silica, clay, talc, magnesium carbonate, magnesium hydroxide and the like. Of course the rubber component and filler are not limited to these examples. Further, various additives, e.g. sulfur, vulcanization accelerator and the like may be added in the rubber compound, The computer system 1 implementing the simulating method according to the present invention comprises, as shown in FIG. 1, a main portion 1a, a keyboard 1b and a mouse 1c as input devices, a display 1d and a printer (not shown) as output devices and the like. The main portion 1a comprises a CPU, a ROM, a work memory, a mass-storage device such as magnetic disk, an optical disk drive 1a1, a flexible disk drive 1a2 and the like. In the mass-storage device, the after-mentioned procedure (program) for executing the simulation method according to the present invention is stored.

Figure 2:
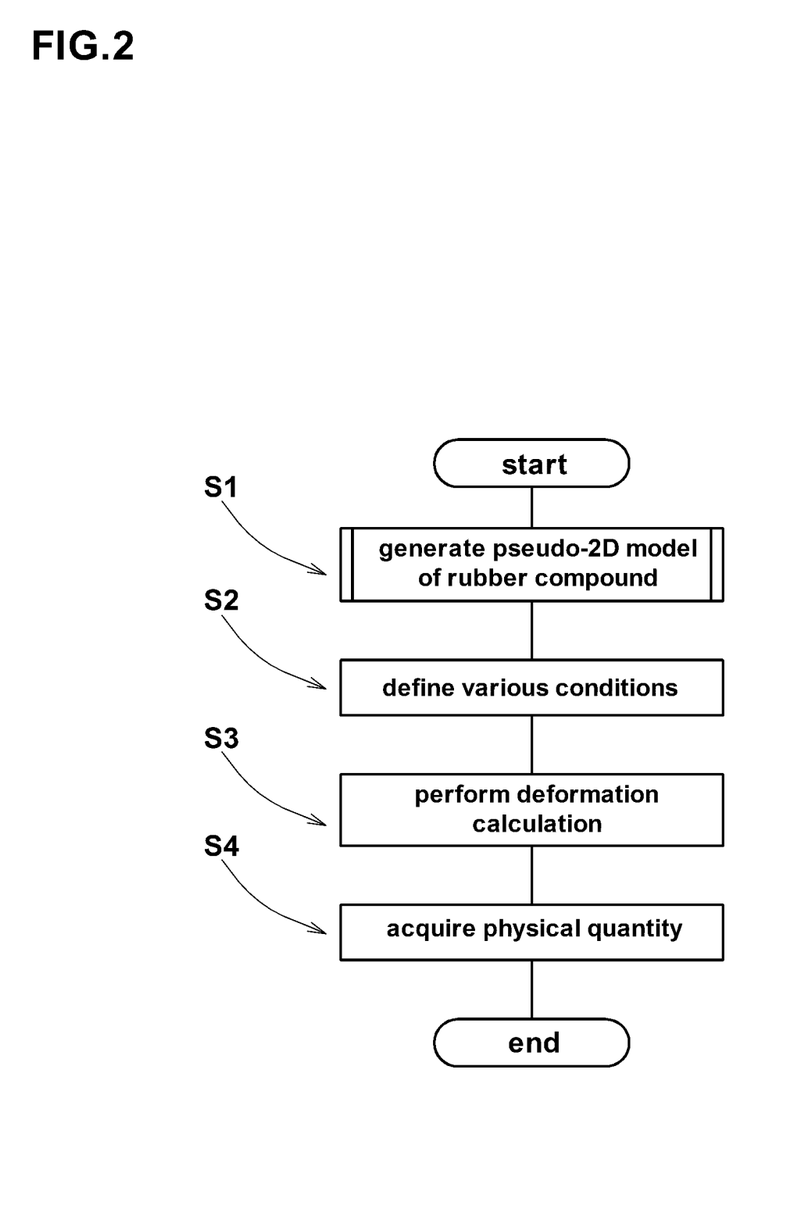
FIG. 2 is a flow chart of the method for simulating deformation of a rubber compound according to the present invention.

FIG. 2 shows an example of the method using the computer system 1.

*Pseudo-2D rubber compound model generating step S1

In this step S1, a pseudo-two-dimensional rubber compound model is defined by the computer system 1.

Figure 3:
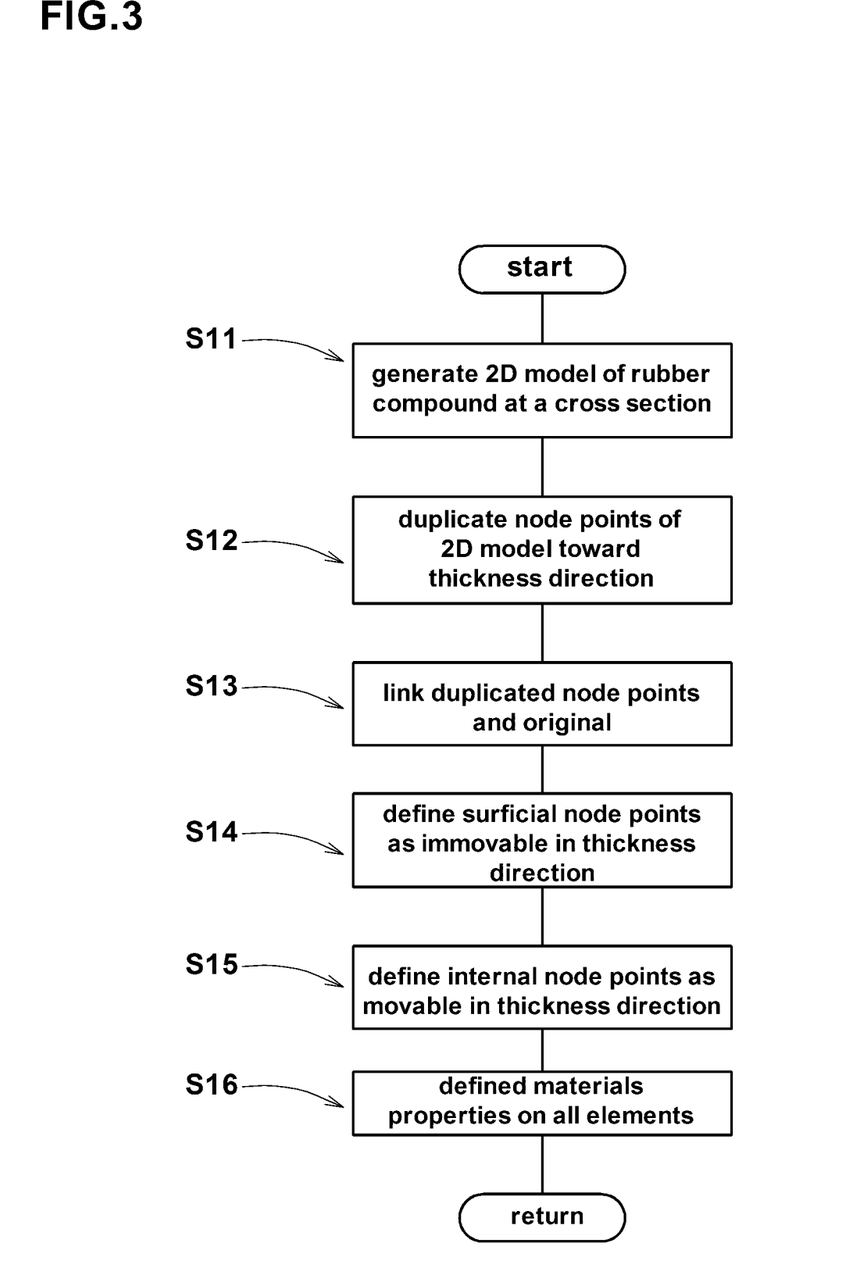
FIG. 3 is a flow chart of a method for generating the pseudo-two-dimensional rubber compound model according to an embodiment of the present invention.

In this embodiment, this step S1 comprises further steps as shown in FIG. 3.

**Step S11

Firstly, a two-dimensional model M2 of the rubber compound (regardless of whether existent or nonexistent) at a cross section is defined.

Figure 4:
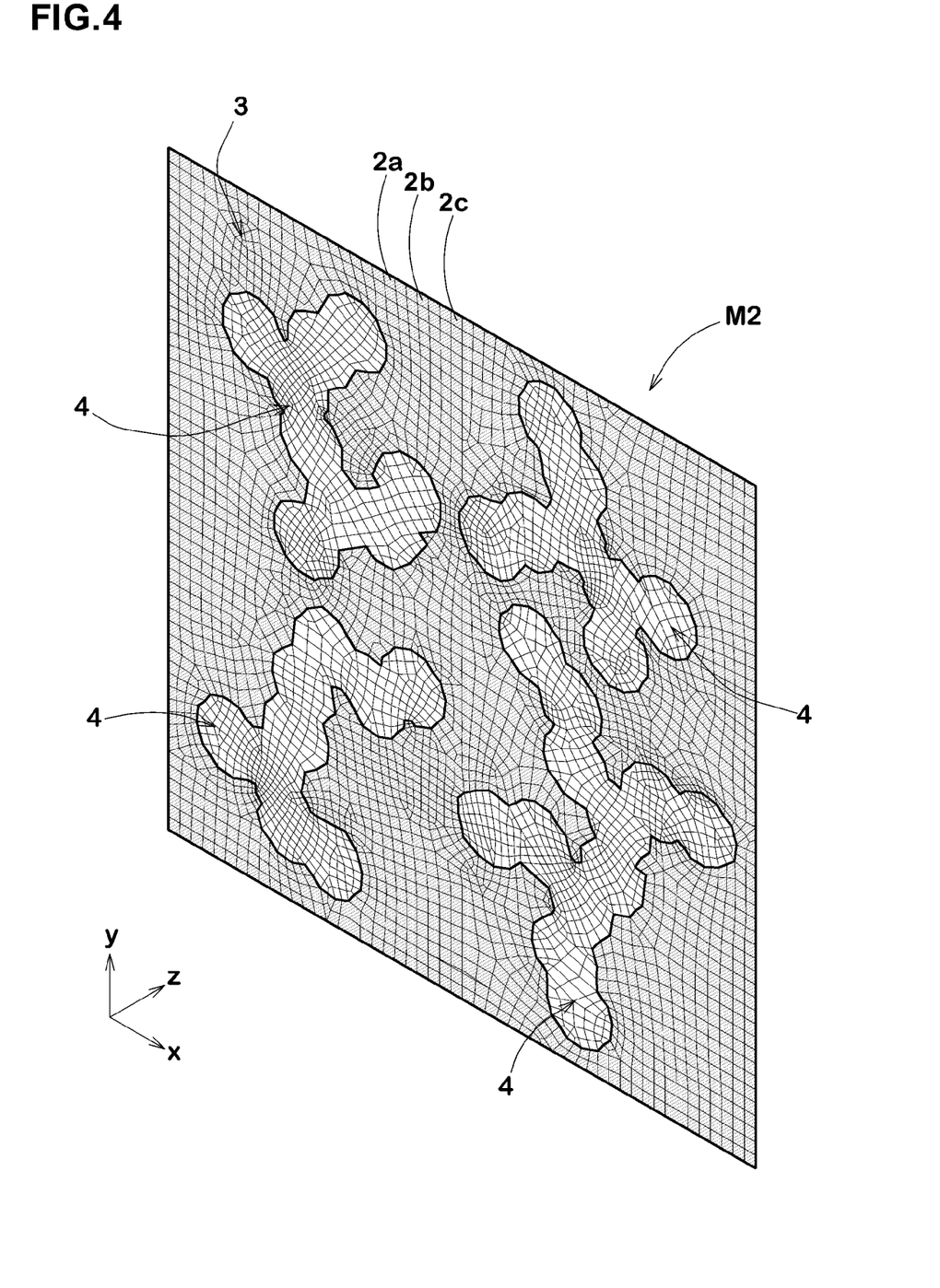
FIG. 4 shows an example of the two-dimensional rubber compound model (microscopic structure).

FIG. 4 shows an example of the two-dimensional model M2. In this example, the two-dimensional model M2 is of a microscopic region of the rubber compound which is discretized by the use of a finite number of elements 2a, 2b, 2c—. Each of the elements 2a, 2b, 2c—is a two-dimensional element having node points and sides linking the node points. For example, a triangular or quadrilateral element is preferably used. The size of the microscopic region or the two-dimensional model M2 is for example, 300 nm×300 nm.

The two-dimensional model M2 comprises a model 3 of the rubber matrix (shaded area in FIG. 4) and models 4 of the filler particles dispersed in the rubber matrix (non-shaded area in FIG. 4). Accordingly, the filler particle models 4 are also dispersed in the rubber matrix model 3 correspondingly to the content percentage of the filler particles. And the rubber matrix model 3 constitutes the remaining major part of the two-dimensional model M2.

In FIG. 4, there is shown an example of the dispersion state of the filler particle models 4, wherein the particles have a spherical shape and aggregate into a plurality of masses having irregular contours.

If needed, the two-dimensional model M2 may further comprises, between the rubber matrix model 3 and the filler particle models 4, interface models (not shown) of interfaces between the filler particles and the rubber matrix. The interface model has a small thickness corresponding to for example one to three elements.

**Step S12

In the step S12, the node points of the two-dimensional model M2 are duplicated at least once in the thickness direction thereof, namely, a direction (z-direction) perpendicular to the plane of the two-dimensional model M2.

Figure 5A:
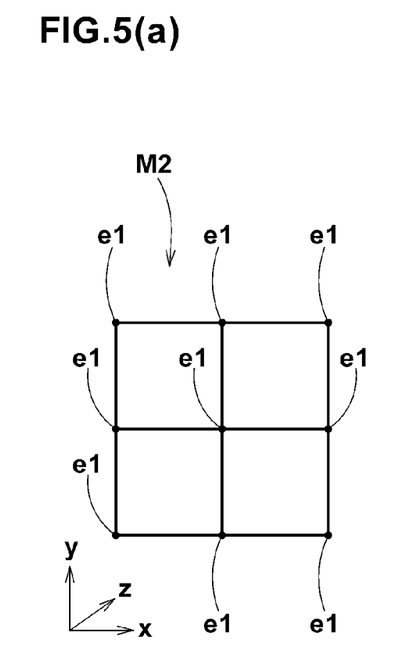
FIGS. 5(a), 5(b) and 5(c) diagrams for explaining the method for generating the pseudo-two-dimensional rubber compound model shown in FIG. 3.
Figure 5B:
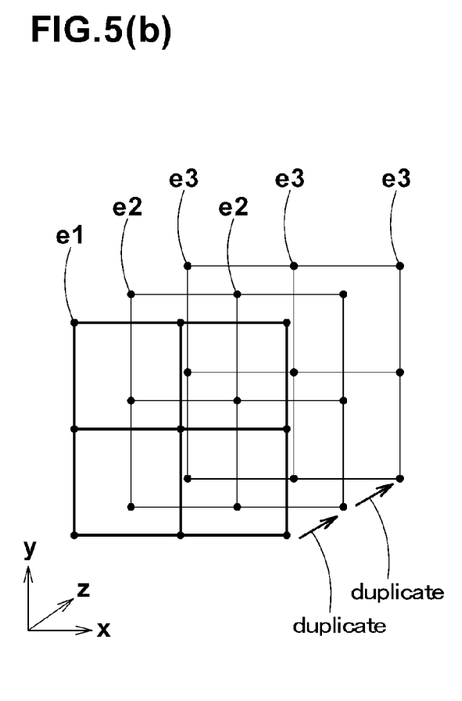
Figure 5C:
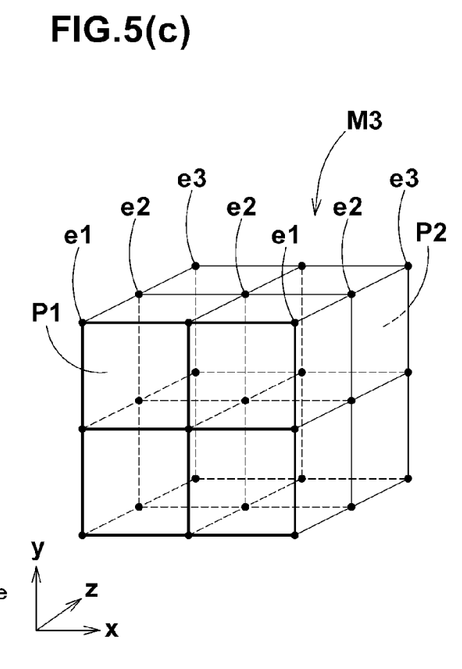

FIGS. 5(a) to 5(c) show such operations in chronological order. In FIG. 5(a), the two-dimensional model M2 shown in FIG. 4 is simplistically shown for convenience sake.

In FIG. 5(b), the node points e1 of the two-dimensional model M2 are duplicated twice toward one thickness direction at predetermined intervals.

Thus, node points e2 at a distance (one interval) in the thickness direction from the two-dimensional model M2 and node points e3 at a distance (two intervals) in the thickness direction from the two-dimensional model M2 are newly defined. Further, the node points e2 are linked with each other through sides similarly to the two-dimensional model M2.

Also, the node points e3 are linked with each other through sides similarly to the two-dimensional model M2.

Thus, the two-dimensional models identical to the original two-dimensional model M2 are newly defined at different positions in the thickness direction from the original two-dimensional model M2.

**Step S13

In the step S13, as shown in FIG. 5(c), the original node points e1, the duplicated node points e2, and the duplicated node points e3 which are adjacent in the thickness direction are respectively linked, and thereby a pseudo-two-dimensional rubber compound model M3 made up of three-dimensional elements is defined. Accordingly, the pseudo-two-dimensional rubber compound model M3 has the same cross section in succession in the thickness direction (z-direction).

The pseudo-two-dimensional rubber compound model M3 has a surface P1 and a surface P2 which are opposite in the thickness direction. The node points e1 on the surface P1 are named as first surficial node points. The node points e3 on the surface P2 are named as second surficial node points. The node points e2 therebetween are named as internal node points.

**Step S14

In the step S14, on the first and second surficial node points, conditions are defined such that the surficial node points are immovable in the thickness direction (z direction) but movable in two-dimensional directions perpendicular to in the thickness direction (x and y directions).

**Step S15

In the step S15, on the internal node points, conditions are defined such that the internal node points are movable in every directions (x, y and z directions).

Since the pseudo-two-dimensional rubber compound model M3 has the elements whose node points are movable in every directions, it becomes possible to obtain a converged solution even if the deformation becomes relatively large during calculation. Thus, it is possible to make a large deformation calculation.

**Step S16

In the step S16, on the pseudo-two-dimensional rubber compound model M3, materials properties are defined. Specifically, on the elements of the rubber matrix model 3, materials properties of the rubber matrix are defined. On the elements of the filler particle model 4, materials properties of the filler particles are defined.

Thereby, the pseudo-two-dimensional rubber compound model M3 is generated.

Figure 6:
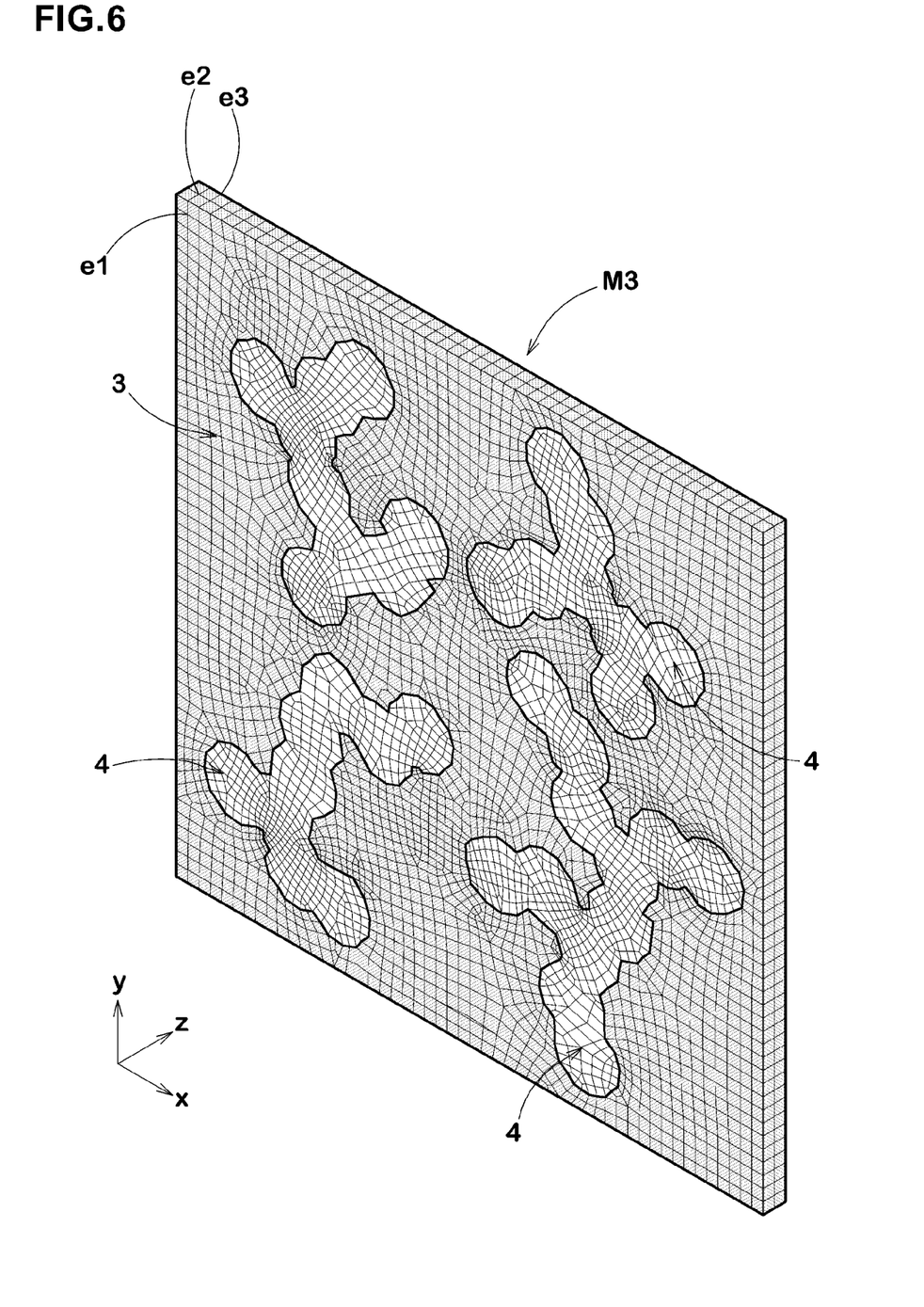
FIG. 6 shows the pseudo-two-dimensional rubber compound model based on the two-dimensional rubber compound model shown in FIG. 4.

FIG. 6 shows the pseudo-two-dimensional rubber compound model M3 formed by duplicating the two-dimensional model M2 shown in FIG. 4.

The process returns to the next step S2 shown in FIG. 3.

*Condition Defining Step S2

In the step S2, conditions necessary to perform a deformation calculation or simulation are defined for the pseudo-two-dimensional rubber compound model M3. For example, such conditions to cause a tensile deformation of the rubber compound model M3 by applying an arbitrary strain rate in y-direction in FIG. 6 are defined. Of course the deformation conditions are not limited to such example.

*Simulation Step S3

In the step S3, using the pseudo-two-dimensional rubber compound model M3, the deformation simulation is made under the above-mentioned conditions.

Such simulation (deformation calculations) can be made by the use of a computer software, for example, an engineering analysis applications software "LS-DYNA" developed by Livermore software Technology Corporation.

The simulation is carried out based on a homogeneization method (asymptotic expansion homogeneization method). In the homogeneization method, two independent variables are used. One is yi representing a microscopic structure (called "unit cell" in the homogeneization method) such as the microscopic structure of the pseudo-two-dimensional rubber compound model M3 as shown in FIG. 6.

The other is xi representing the entirety of a rubber compound periodically including the microscopic structures.

By making an asymptotic expansion of the independent variable yi in a field of a microscopical scale and the independent variable xi in a field of a macroscopical scale, an average mechanical response of the entirety of the rubber compound in which the model of the microscopic structure as shown in FIG. 6 is reflected can be obtained approximately.

*Physical Quantity Acquiring Step S4

In the step S4, from the results of the deformation calculation, necessary physical quantities are acquired and output by the use of the output device.

For example, it is possible to output visually, a time-series change in shape of the elements of the pseudo-two-dimensional rubber compound model M3, a distribution of a physical quantity and the like.

Figure 7:
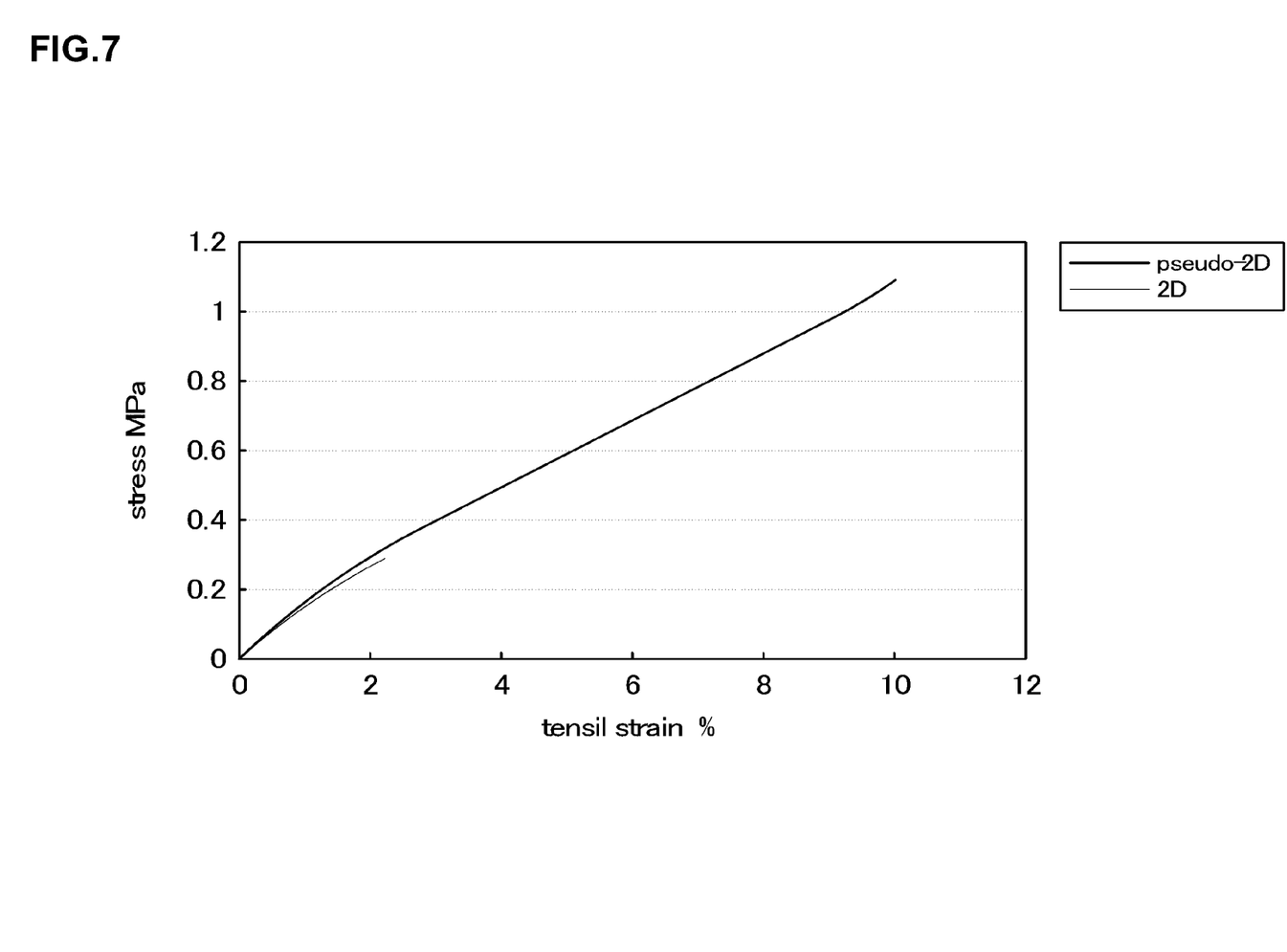
FIG. 7 is a stress-strain curves obtained from simulating methods using the pseudo-two-dimensional rubber compound model and the two-dimensional rubber compound model.

FIG. 7 shows a stress-strain curve obtained from the results of the deformation calculation as the necessary physical quantities.

In FIG. 7, also shown is a stress-strain curve obtained from the results of the deformation calculation performed by the use of the two-dimensional rubber compound model M2 shown in FIG. 4.

In either case, from the microscopic structure, the overall structure was created through a homogeneization method as disclosed in Japanese patent application publication P2010-205165A, and a tensile deformation was simulated by applying a tensile strain in y-direction at a strain rate of 100 mm/min, wherein the dimensions of the field of macroscopical scale were 20 mm×20 mm, and the maximum deformation was 2 mm (maximum strain=10%).

As shown in FIG. 7, in the case of the two-dimensional model M2 shown in FIG. 4, the calculation was stopped when the strain was increased to about 2%. However, in the case of the pseudo-two-dimensional model M3 shown in FIG. 6, the calculation could be continued until the strain was increased to about 10%. Further, the model generation time was almost same as that in the two-dimensional model M2.

The invention claimed is:

1. A computerized method for simulating deformation of a rubber compound with filler particles comprising the steps of:

generating a pseudo-two-dimensional rubber compound model of the rubber compound, wherein the step of generating the pseudo-two-dimensional rubber compound model comprises the steps of:

generating, with a processor, a two-dimensional model of the rubber compound at a cross section thereof on an X-Y plane in an X-Y-Z Cartesian coordinate system, wherein the two-dimensional model comprises a two-dimensional model of a rubber matrix and two-dimensional models of the filler particles;

storing the two-dimensional model in a memory;

duplicating, by the processor, node points of the two-dimensional model at least twice in a Z direction in the X-Y-Z Cartesian coordinate system;

respectively linking, by the processor, the node points of the two-dimensional model with the duplicated node points adjacent thereto in the Z direction;

respectively linking, by the processor, the duplicated node points with next duplicated node points; and converting the two-dimensional model to a three-dimensional model having surficial node points on opposite surfaces and internal node points therebetween after the steps of duplicating and linking, the three-dimensional model including a three-dimensional model of the rubber matrix and three-dimensional models of the filler particles, each three-dimensional model having a same cross section along the Z direction;

defining the surficial node points of the pseudo-two-dimensional rubber compound model as being immovable in the Z direction for a deformation simulation;

defining the internal node points of the pseudo-two-dimensional rubber compound model as being movable in the Z direction for the deformation simulation;

performing a deformation calculation in the deformation simulation by using the pseudo-two-dimensional rubber compound model; and acquiring a necessary physical quantity of the rubber compound from the deformation calculation; and outputting the acquired physical quantity.

2. The method according to claim 1, wherein the acquired physical quantity of the rubber compound is a relationship between strain and stress of the rubber compound.

* * * * *